United States Patent [19]
Toda

[11] Patent Number: 6,144,931
[45] Date of Patent: *Nov. 7, 2000

[54] WAFER EXPANSION-AND-CONTRACTION SIMULATING METHOD

[75] Inventor: Takeshi Toda, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/048,530

[22] Filed: Mar. 26, 1998

[30] Foreign Application Priority Data

Mar. 27, 1997 [JP] Japan .................................. 9-075215

[51] Int. Cl.⁷ .................................................. G06F 17/50
[52] U.S. Cl. ............................................ 703/13; 257/633
[58] Field of Search .......................... 703/13, 2; 324/760, 324/754, 757, 768; 257/178, 633; 403/28; 505/191, 330

[56] References Cited

U.S. PATENT DOCUMENTS

| | | | |
|---|---|---|---|
| 4,567,432 | 1/1986 | Buol et al. .............................. | 324/760 |
| 5,444,475 | 8/1995 | Mitani ..................................... | 347/200 |
| 5,521,523 | 5/1996 | Kimura et al. .......................... | 324/760 |
| 5,546,811 | 8/1996 | Rogers et al. ............................ | 73/800 |
| 5,570,032 | 10/1996 | Atkins et al. ........................... | 324/760 |
| 5,570,251 | 10/1996 | Shinoura et al. ........................ | 360/126 |
| 5,667,597 | 9/1997 | Ishihara .................................. | 136/258 |

OTHER PUBLICATIONS

C.–J. Lin et al., "Observation of domain expansion and contraction in TbFe films by Lorentz microscopy", IEEE Transactions on Magnetics, vol. 24, No. 6, Nov. 1988, pp. 2311–2313.

K. Boggs et al., "Stress Development During High Dielectric Ceramic Thin Films Processing", Proceedings of the 1994 Int'l Conf. On Multichip Modules, 1994, pp. 350–355.

S. Belikov et al., "Closed–Loop Adaptive Control for Rapid Thermal Processing", Proceedings of the 34th IEEE Conf. on Decision and Control, 1995, vol. 3, pp. 2476–2481.

P. Subrahmanyam et al., "High Field Stressing Effects on the Split N2O Grown Thin Film Gate Dielectric by Rapid Thermal Processing", IEEE Transactions on Electron Devices, vol. 44, No. 3, Mar. 1997, pp. 505–508.

T. Hodge et al., "Stresses in Thin Film Metallization", IEEE Transactions on Components, Packaging, and Manufacturing Technology, Part A, vol. 20, No. 2, Jun. 1997, pp. 241–250.

J. Hebb et al., "The Effects of Patterns on Thermal Stress During Rapid Thermal Processing of Silicon Wafers", IEEE Transactions on Semiconductor Manufacturing, vol. 11, No. 1, Feb. 1998, pp. 99–107.

(List continued on next page.)

*Primary Examiner*—Eric W. Stamber
*Assistant Examiner*—Russell W. Frejd
*Attorney, Agent, or Firm*—Hutchins, Wheeler & Dittmar

[57] ABSTRACT

A wafer expansion-and-contraction simulation method in which stress (intrinsic stress) caused in a film forming process on a wafer is taken into consideration, the calculation time can be shorten, and a storage amount of data can be reduced. In the simulation method, an elastic thermal stress simulation when the temperature of the silicon wafer is increased from the room temperature to the film forming temperature is performed, and the displacement of the wafer thus obtained is reserved. Thereafter, an elastic thermal stress simulation when the temperature of the silicon wafer coated with the thin film is decreased from the film forming temperature to the room temperature is performed, and the displacement of the wafer thus obtained is reserved. In the simulation, thermal strain is uniformly applied to the thin film as corresponding to an intrinsic stress in the film forming process. Finally, the displacement values in the respective steps are added to obtain the total displacement due to the expansion and contraction of the wafer in the film forming process.

15 Claims, 2 Drawing Sheets

OTHER PUBLICATIONS

Y. Zou et al., "Three–Dimensional Die Surface Stress Measurements in Delaminated and Non–Delaminated Plastic Packages", 48th IEEE Electronic Components & Technology Conference, 1998, pp. 1223–1234.

Hamajima, T. et al., "Thermal Stress Evaluation for in SOI Substrate with Trench and LOCOS Isolation", The Japan Society of Applied Physics and Related Societies, p. 733, Extended Abstracts, 1993.

6,144,931

WAFER EXPANSION-AND-CONTRACTION SIMULATING METHOD

BACKGROUND OF THE INVENTION

1. Field of the Invention

The present invention relates to a method of simulating expansion and contraction amount of a wafer, and particularly to a simulation method for the expansion and contraction amount of a wafer in a thin film growth process.

2. Description of the Related Art

Recently, large-scale integrated circuits (hereinafter referred to as "LSI") has been designed in a more minute structure and semiconductor wafers have been designed to have a large diameter, and such a tendency has made more critical the expansion and contraction of the wafers induced in a thin film growth process for manufacturing an LSI chip.

Some countermeasures have been taken to solve the above problem, and it has been indispensable to establish a simulation method for the expansion and contraction of wafers in order to enhance the efficiency of the developments of the devices.

In an example of a method of simulating the expansion and contraction of wafers by using a conventional technique, a displacement amount is calculated on the basis of a thermal stress simulation using a finite element method when a thermal load and a restraint are given as disclosed by Hamajima, et al. in Extended Abstracts (The 40th Spring Meeting, 1993); The Japan Society of Applied Physics and Related Societies, p. 733. FIG. 1 is a diagram showing a case where a simulation of the expansion and contraction of a wafer in a thin film growth process is performed by using the conventional technique.

In a first stage, a thermal stress analysis when the temperature of a silicon wafer 1 is increased from the room temperature to the film forming temperature as shown at the upper side (a) of FIG. 1 is performed. Reference numerals 2$a$ and 2$a'$ denote the wafer at the room temperature and the film forming temperature, respectively. The residual stress values $\sigma s1r$, $\sigma s1z$, $\sigma s1\theta$, $\tau s1rz$ and the displacement values $us1r$, $us1z$ are reserved.

In a second stage, as shown at the lower side (b) of FIG. 1, a thermal stress analysis when a thin film 2 made of $Si_3N_4$ is formed on the silicon wafer 1 having the residual stress $\sigma s1$ and the displacement $us1$, which have been reserved in the first stage, and the temperature is decreased from the film forming temperature to the room temperature. Reference numerals 2$b$ and 2$b'$ denote the wafer and thin film at the film forming temperature and the room temperature, respectively. The residual stress values $\sigma s2r$, $\sigma s2z$, $\sigma s2\theta$, $\tau s2rz$ and the displacement values $us2r$ and $us2z$ of the wafer 1 thus obtained and the residual stress values $\sigma f2r$, $\sigma f2z$, $\sigma f2\theta$, $\tau f2rz$ and the displacement values $uf2r$ and $uf2z$ of the thin film 2 are determined. In the conventional technique, the displacement values $us2r$ and $us2z$ of the wafer which are obtained in the second stage are set as the expansion-and-contraction amount of the wafer in the thin film forming process.

The conventional technique has the following problems.

A first problem resides in that the residual stress values must be kept in each step, so that the data storage amount is large and the large storage capacity (memory capacity, disc capacity) is necessary.

A second problem resides in that a time period for calculation processing due to data read-out is increased in each step.

A third problem resides in that a result obtained by calculating the displacement in the film forming process of $Si_3N_4$ by using the conventional method is greatly different from the actual measurement result. This is because the conventional technique takes no consideration of the intrinsic stress in the film forming process.

SUMMARY OF THE INVENTION

A first object of the present invention is to provide a method of simulating the expansion and contraction of a wafer in consideration of a stress (intrinsic stress) generated in a film forming process.

A second object of the present invention is to provide a method of simulating the expansion and contraction of a wafer, which can reduce the storage amount of data and shorten a calculation time.

In order to solve the above problems and attain the above objects, the present invention includes the following steps.

1. A displacement of a wafer in a step of increasing the temperature to a film forming temperature, and a displacement of the wafer in a step of forming a thin film and decreasing the temperature to the room temperature are independently calculated, and then the displacement values of the wafer are summed.

2. The calculation is performed so that the intrinsic stress of the thin film is uniformly applied to the whole thin film by giving initial strain as thermal strain.

The displacements are calculated by means of, for example, a finite element method or a boundary element method.

The displacement and the stress approximately establishes a linear combination in a linearly elastic range. When a displacement in a step A and a displacement in a step B can be represented by f(A) and f(B) respectively, the total displacement f(A+B) based on the two steps (A+B) is approximately expressed as follows with sufficient precision:

$$F(A+B)=f(A)+f(B)$$

The result which is necessary for this simulation is the displacement of the wafer. In the present invention, the data of the residual stress and the displacement data of the thin film can be omitted, and thus the read-out time can be reduced by the amount corresponding to the omission of the data.

Further, by giving the intrinsic stress in terms of the thermal stress which is uniformly generated in the film, the displacement due to the expansion and contraction of the wafer in consideration of the intrinsic stress can be calculated.

DETAILED DESCRIPTION OF THE PREFERRED EMBODIMENT

A preferred embodiment according to the present invention will be described hereunder with reference to the accompanying drawings.

Figure 1:
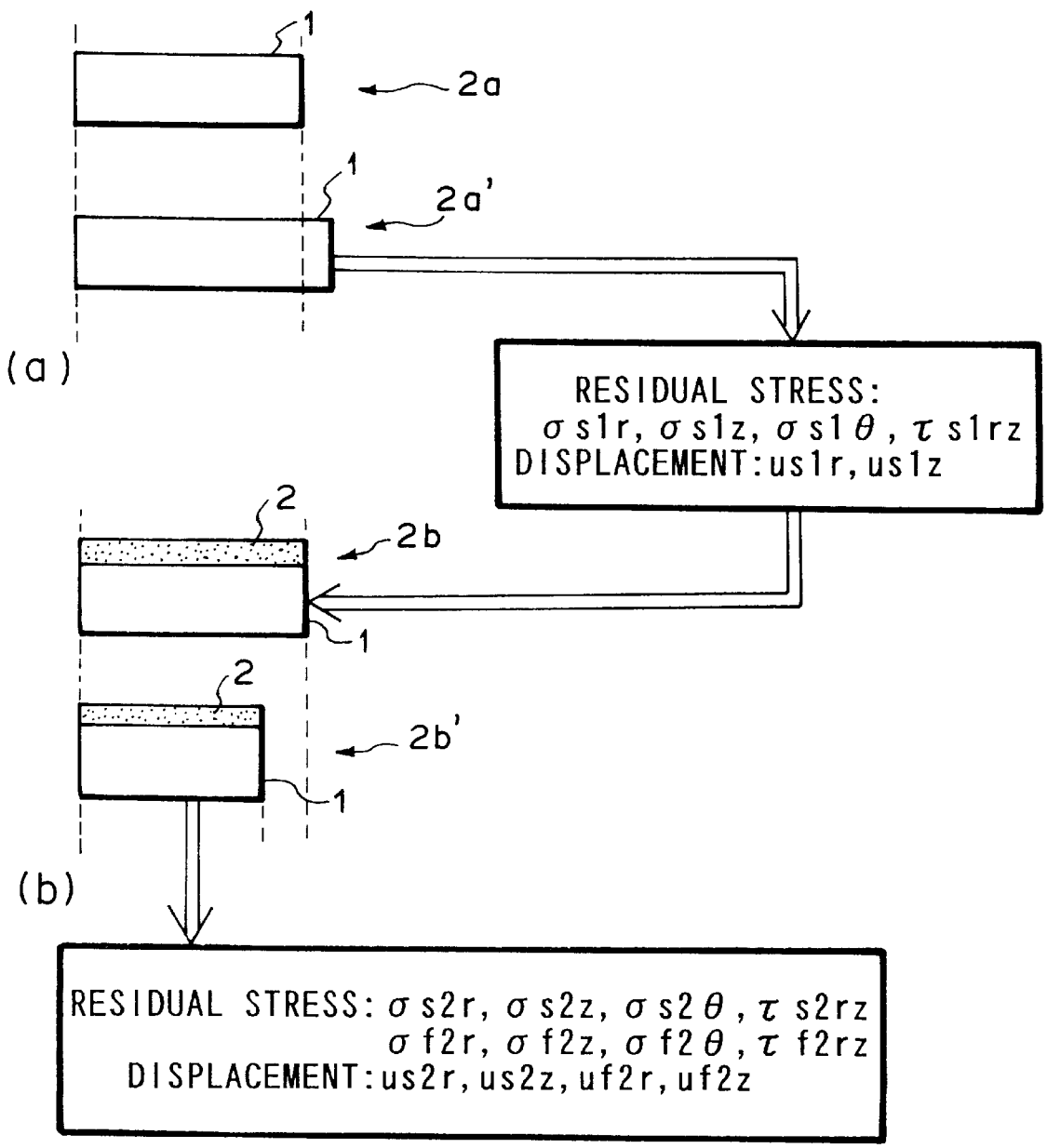
FIG. 1 is a block diagram showing a conventional technique.
Figure 2:
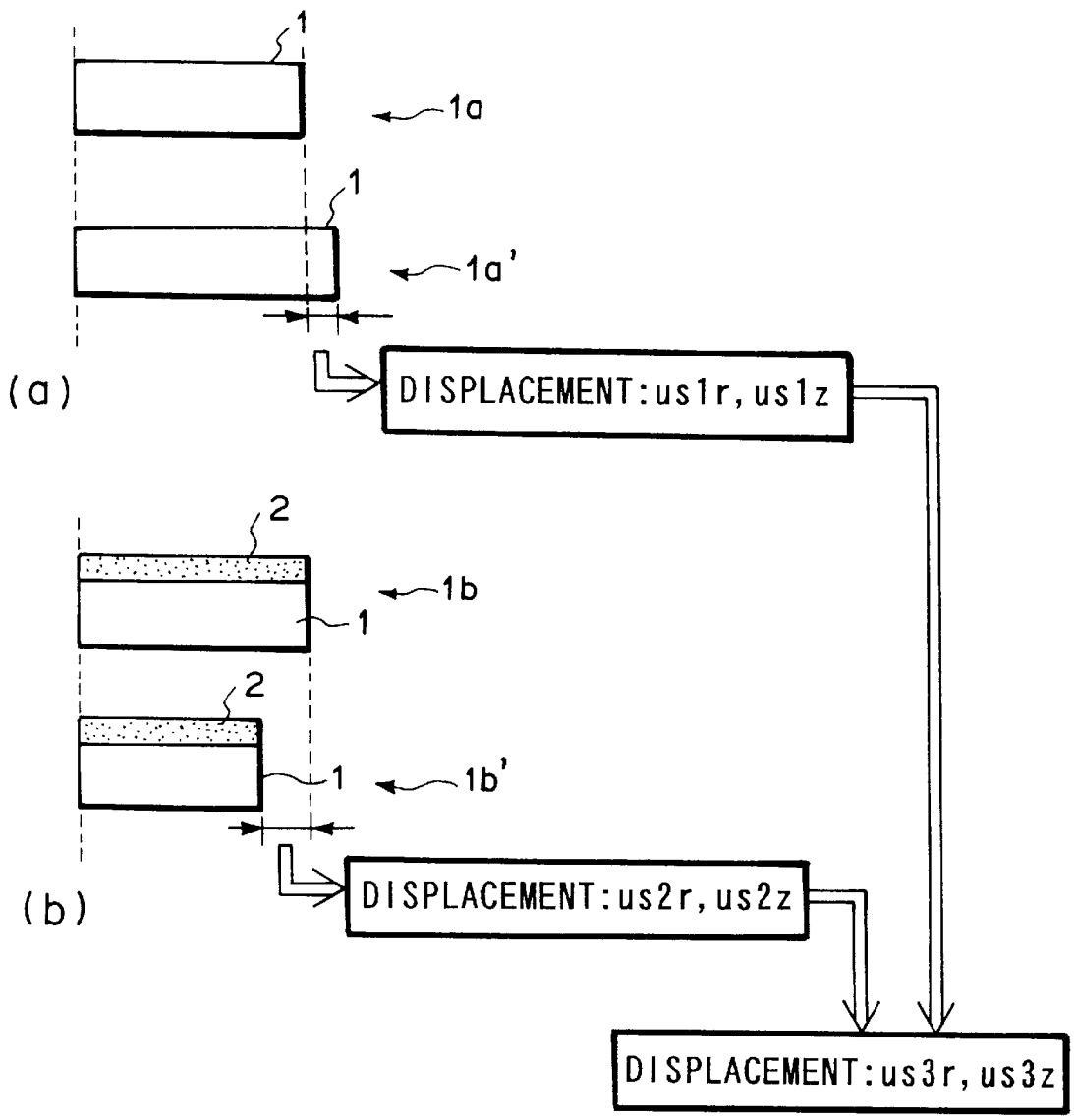
FIG. 2 is a block diagram showing an embodiment of the present invention.

FIG. 2 is a diagram showing a simulation method of determining the displacement of a silicon wafer according to an embodiment of the present invention when the temperature of the wafer is increased from 25° C. to 700° C., then a $Si_3N_4$ film is grown onthe wafer and then the wafer temperature is decreased from 700° C. to 25° C.

First, in a first stage, a stress analysis when the silicon wafer temperature is increased is performed by means of a finite element method or a boundary element method. An elastic thermal stress simulation is performed on the silicon wafer 1 by using a two-dimensional axially symmetric model when the temperature is increased from the room temperature of 25° C. to the film forming temperature of 700° C. as shown at the upper side (a) of FIG. 2. Reference numerals 1a and 1a' denote the wafer at the room temperature 25° C. and the film forming temperature 700° C., respectively. The displacement values us1r, us1z which are obtained as the result of the elastic thermal stress simulation are reserved.

In a second stage, a stress analysis when the $Si_3N_4$ film is grown on the silicon wafer 1 and the temperature is decreased from the film forming temperature to the room temperature is performed. An elastic thermal stress simulation of the silicon wafer having the $Si_3N_4$ film formed thereon at the film forming temperature of 700° C. is performed as shown at the lower side (b) of FIG. 2. Reference numerals 1b and 1b' denote the wafer and thin film at the film forming temperature and the room temperature, respectively. The displacement values us2r, us2z thus obtained are reserved as in the case of the first stage.

In the second stage, the thermal strain corresponding to $\Delta T=(25-700)°$ C. is applied to the silicon wafer, and the thermal strain corresponding to $\Delta T=(25-1660)°$ C. is uniformly applied to the overall $Si_3N_4$ film 2. The initial temperature of 1660° C. is set to the $Si_3N_4$ because the intrinsic stress was estimated to $-9.5 \times 10^8$ Pa on the basis of the actual measurement of the displacement in the $Si_3N_4$ film forming process which was performed by means of CVD method and this value of intrinsic stress corresponded to a thermal strain caused by a temperature difference of 960° C. $(=1660-700)°$ C. Further, it is assumed that the intrinsic stress which occurs in the $Si_3N_4$ film forming process is uniform in the film and there is no shearing stress.

The value of intrinsic stress depends on a condition of the actual film forming process and can be determined in advance by experimentation.

In a final stage, us1r (us1z) and us1z (us2z) are added with each other to calculate the displacement us3r (us3z) due to the expansion and contraction of the wafer caused in the film formation process.

The displacement value due to the expansion and contraction of the wafer thus obtained is coincident with the actual measurement result within 5% precision, and in consideration of the precision of the error of the actual measurement result, it is found that the simulation method of the expansion and contraction of the wafer according to the present invention has sufficient precision.

In this embodiment, only the four data of the wafer displacement values us1r, us1z obtained in the first stage and the wafer displacement values us2r, us2z obtaine in the second stage are required, and the necessary data storage capacity can be reduced by 30% as compared with the conventional technique. Further, the calculation time due to the data read-out operation can be also reduced by 30% as compared with the conventional technique.

The simulation method of the present invention can be performed in which the wafer other than silicon wafer is used, the thin film other than $Si_3N_4$ film is used, the film forming process other than CVD method is used.

According to the present invention, the displacement due to the expansion and contraction of the wafer in consideration of the intrinsic stress can be calculated and the simulation precision can be enhanced.

Further, according to the present invention, only the displacement data of the wafer in the first and second stages are required, and thus the storage capacity for the data and the calculation time due to the data reading can be reduced.

What is claimed is:

1. A computer programmed to perform a wafer expansion-and-contraction simulation method for estimating expansion and contraction of a wafer which is caused when a thin film is formed on the wafer, comprising:

calculating on the basis of a thermal stress analysis a first displacement of the wafer from an initial wafer state stored in a first memory location caused when a temperature of the wafer is increased from a room temperature to a film forming temperature of the thin film, and storing the first displacement in a second memory location;

calculating on the basis of a thermal stress analysis a second displacement of the wafer from the first displacement stored in the second memory location caused when the temperature of the wafer is decreased to the room temperature after the film is formed thereon, and storing the second displacement in a third memory location; and adding the first displacement and the second displacement to estimate an overall expansion and contraction of the wafer from the initial state stored in the first memory location, and storing in a fourth memory location.

2. The computer programmed to perform a wafer expansion-and-contraction simulation method as claimed in claim 1, wherein, in calculating the second displacement, a stress caused when the thin film is formed is uniformly applied into the thin film in terms of thermal strain caused by a temperature difference between the thin film and the wafer.

3. The computer programmed to perform a wafer expansion-and-contraction simulation method as claimed in claim 1, wherein the wafer is a silicon wafer.

4. The computer programmed to perform a wafer expansion-and-contraction simulation method as claimed in claim 1, wherein the thin film is made of $Si_3N_4$.

5. A method executed in a computer of determining an overall displacement of a wafer from an initial state stored in a first memory location subject to a high temperature formation of a film thereon, comprising:

calculating a first displacement from the initial state that varies according to a temperature change from a room temperature to a film formation temperature, and storing the first displacement in a second memory location;

calculating a second displacement from the first displacement that varies according to a temperature change from the film formation temperature to the room temperature, wherein an initial temperature of the film is modified according to an adjustment that varies according to intrinsic stress between the wafer and the film formed thereon, and storing the second displacement in a third memory location; and calculating the overall displacement by adding the first and second displacements to determine overall displacement of the wafer from the initial state stored in the first memory location, and storing the overall displacement in a fourth memory location.

6. A method, according to claim 5, further comprising:
determining the adjustment by experimentation.

7. A method, according to claim 6, wherein the experimentation includes making measurements of displacement of an actual film on an actual wafer.

8. A method, according to claim 5, wherein the first and second displacements are calculated using thermal stress analysis.

9. A method, according to claim 5, wherein the wafer is a silicon wafer.

10. A method, according to claim 5, wherein the film is $Si_3N_4$.

11. A computer program stored in a memory device and capable of simulating overall displacement of a wafer subject to high temperature formation of a film thereon from an initial state stored in a location of the memory device, comprising:

means for calculating a first displacement that varies according to a temperature change from a room temperature to a film formation temperature;

means for calculating a second displacement that varies according to a temperature change from the film formation temperature to the room temperature, wherein an initial temperature of the film is modified according to an adjustment that varies according to intrinsic stress between the wafer and the film formed thereon; and means for calculating the overall displacement by adding the first and second displacements to determine overall displacement of the wafer from the initial state.

12. A computer program, according to claim 11, wherein the adjustment is determined by experimentation that includes making measurements of displacement of an actual film on an actual wafer.

13. A computer program, according to claim 11, wherein the first and second displacements are calculated using thermal stress analysis.

14. A computer program, according to claim 11, wherein the wafer is a silicon wafer.

15. A computer program, according to claim 11, wherein the film is $Si_3N_4$.

* * * * *